(12) United States Patent
Irie

(10) Patent No.: US 7,916,765 B2
(45) Date of Patent: Mar. 29, 2011

(54) CONTROL CIRCUIT FOR A LASER DIODE AND A METHOD TO CONTROL A LASER DIODE

(75) Inventor: Takeshi Irie, Yokohama (JP)

(73) Assignee: Sumitomo Electric Industries, Ltd., Osaka-Shi (JP)

( * ) Notice: Subject to any disclaimer, the term of this patent is extended or adjusted under 35 U.S.C. 154(b) by 0 days.

(21) Appl. No.: 12/185,874

(22) Filed: Aug. 5, 2008

(65) Prior Publication Data

US 2009/0041071 A1    Feb. 12, 2009

(30) Foreign Application Priority Data

Aug. 6, 2007  (JP) ................. 2007-204462

(51) Int. Cl.
*H01S 3/00* (2006.01)
(52) U.S. Cl. .............. 372/38.09; 372/38.02; 372/38.1
(58) Field of Classification Search ............ 372/38.02, 372/38.09, 38.1
See application file for complete search history.

(56) References Cited

U.S. PATENT DOCUMENTS

| | | | | |
|---|---|---|---|---|
| 5,163,063 | A | * | 11/1992 | Yoshikawa et al. ........ 372/38.02 |
| 6,122,302 | A | * | 9/2000 | Dean .................... 372/29.021 |
| 2006/0164712 | A1 | | 7/2006 | Ishibashi |
| 2007/0286610 | A1 | * | 12/2007 | Ishibashi ................ 398/197 |

FOREIGN PATENT DOCUMENTS

JP    2005-123414    12/2005

* cited by examiner

*Primary Examiner* — Minsun Harvey
*Assistant Examiner* — Phillip Nguyen
(74) *Attorney, Agent, or Firm* — Venable LLP; Michael A. Sartori; Kyle D. Petaja

(57) ABSTRACT

A control circuit for a laser diode is disclosed, in which the driving current may be suppressed even when the monitor PD breaks down to make the APC feedback control inoperable. The control circuit comprises an LD driver to supply the driving current to the LD, a monitor PD to detect a portion of output light from the LD, and the APC controller to adjust the driving current. The current limiter, when the driving current reaches or exceeds the threshold, controls the driving current Id so as to keep the current in a preset value or a value just before the extraordinary increase of the driving current occurs.

5 Claims, 4 Drawing Sheets

CONTROL CIRCUIT FOR A LASER DIODE AND A METHOD TO CONTROL A LASER DIODE

BACKGROUND OF THE INVENTION

1. Field of the Invention

The present invention relates to a control circuit for a semiconductor laser diode (hereafter denoted as LD), and a method to control the control circuit.

2. Related Prior Art

Typical optical transmitter applied in an optical communication system provides a function of the auto-power control (hereafter denoted as APC) to keep the average optical power and the extinction ratio of the light emitted from the laser diode. The APC loop generally includes a monitor photodiode (hereafter denoted as PD) to detect the output power of the LD, and a controller to adjust the magnitude of the driving current so as to keep the average output power and the extinction ratio of the output light based on the monitored result. The Japanese Patent application published as JP-2005-123414A has disclosed such an APC control system.

The ordinary APC system usually increases the driving current when the monitor PD breaks down to fallen its output. In such a condition, the APC system decides that the optical output power from the LD decreases and increases the driving current so as to recover the output power from the LD, which results in an extraordinarily optical power from the LD and occasionally brings a situation out of the safety standard. The system disclosed in the prior patent described above inserts a current limited comprised of a resistor in a current path to the LD to suppress the excess current. However, it is well known that ordinary LD shows large temperature dependence in its performance and characteristics. Therefore, the driving current necessary to obtain a preset power is small in a low temperature, while, it becomes large in a high temperature. That is, the maximum current determined by the limiter resistance in the low temperature occasionally is less than a current necessary to obtain the present optical power at the high temperature.

The present invention, taking the subject mentioned above, is to provide a control circuit for the LD able to suppress the increase of the driving current even when the monitor PD breaks down, and to provide a method to control the LD.

SUMMARY OF THE INVENTION

An aspect of the present invention relates to a configuration of a control circuit for the LD. The control circuit of the invention comprises an LD driver, a monitor PD and a current limiter. The LD driver supplies the driving current, which includes the bias current and the modulation current, to the LD. The monitor PD detects a portion of the signal light emitted from the LD and generates the source signal corresponding to the portion of the signal light. The current limiter includes the APC controller that constitutes the APC feedback loop co-operating with the LD, the monitor PD and the LD driver. A feature of the control circuit of the invention is that the current limiter sets a preset value independent of the APC feedback loop in the driving when the APC feedback loop falls in a failure mode.

The preset value may reflect the driving current supplied to the LD just before the APC feedback loop falls in the failure mode. Moreover, the current limiter may decide whether the APC feedback loop falls in the failure mode or not by comparing the driving current with a threshold that may be determined depending on the temperature of the LD.

The control circuit thus configured may temporarily operate in a semi-normal mode even after the failure occurs as long as the temperature of the LD does not widely change.

Another aspect of the invention relates to a method to control a semiconductor laser diode that is operable by the APC feedback loop including the LD, the monitor PD, the APC controller, and the LD driver. A feature of the method of the invention is that the method sets a preset signal in the LD driver when the APC feedback loop falls in the failure mode. The preset signal reflects a source signal output from the monitor PD just before the APC feedback loop falls in the failure mode.

DESCRIPTION OF PREFERRED EMBODIMENTS

Next, embodiments of an LD driver and a method to drive an LD according to the present invention will be described as referring to accompanying drawings. In the description of the drawings, the same numerals and the same symbols will refer to the same elements without overlapping explanations. Also, in the description below, a transistor means both bipolar transistor and field effect transistor (FET). For the FET, the base, collector and emitter electrodes are regarded as the gate, drain and source electrodes, respectively.

Figure 1:
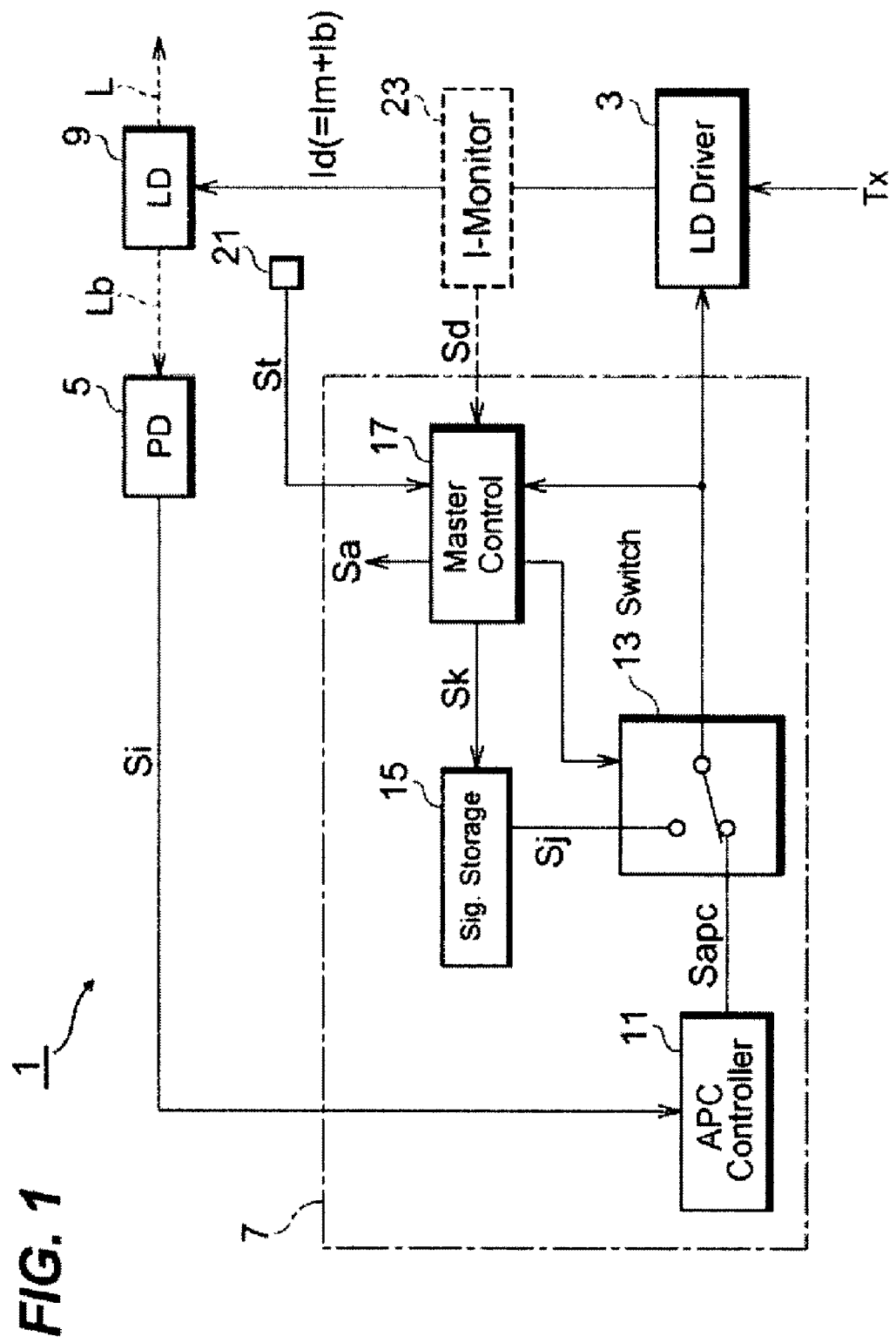
FIG. 1 is a block diagram of the LD driver according to an embodiment of the invention.

FIG. 1 is a block diagram of the control circuit according to the present invention. The control circuit 1 supplies a driving current Id to the LD 9, and includes an LD driver 3, a monitor PD 5, a current limiter 7 and a temperature sensor 21.

The LD driver 3 drives the LD 9 in high speeds, generates the driving current Id and supplies this driving current to the LD 9. The driving current Id includes a bias current Ib, which is a DC current, and a modulation current Im, which corresponds to the driving signal Tx with high frequency components and externally provided thereto. The LD driver 3 superposes the modulation current Im on the bias current Ib to generate the driving current Id (=Ib+Im).

The monitor PD 5 detects a portion of light Lb emitted from the back facet of the LD 9 and generates a source signal Si that indicates a magnitude of the light Lb. The monitor PD 5 may be a PIN-PD. Although the monitor PD of the present invention is arranged behind the LD 9 to sense the back facet light Lb, another arrangement for the monitor PD 5 is applicable, in which the PD 5 is placed in front of the LD 9 to detect a portion of the front light of the LD 9 split by the beam splitter.

The current limiter 7 controls the driving current Id. Functions of the current limiter 7 are: (1) to control the driving current Id such that the current limiter 7 keeps the average power and the extinction ratio of the light emitter from the LD 9 in respective preset values by receiving the source signal Si from the PD 5, which is often called as the automatic power control (APC); and (2), when the driving current extraordinary increases to reach or exceed a threshold current due to a failure of the monitor PD 5 or something like that, which is called as the failure mode of the APC feedback loop, the current limiter 7 keeps the driving current Id in a preset value or a value just before the APC feedback loop falls in the failure mode.

The current limiter 7 of the present embodiment includes an APC controller 11, a switch 13, a signal storage 15, and a master control 17. The APC controller 11, by receiving the source signal Si, outputs a command Sapc. The APC controller 11 provides this command Sapc to the LD driver 3 so as to keep the source signal Si in the present value, which is equivalent to a condition that the average output power and the extinction ratio of the light emitted from the LD 9 are kept in the preset value. The switch 13, connected between the APC controller 11 and the LD driver 3, selects one of commands, Sapc or Sj. Although FIG. 1 illustrates the switch 13 as a mechanical switch, active devices such as FET and bipolar transistor may be suitable.

The signal storage 15 stores a command Sj. The signal storage 15 may create this command Sj by receiving a signal Sk, which corresponds to the command Sapc, from the master control 17, or by monitoring the driving current Id directly with a monitoring unit 23. As shown by a broken line in FIG. 1, it is applicable to generate a signal Sd by detecting the driving current Id directly from the LD driver 3 with the monitoring unit 23, to process this signal Sd in the master control 17, and to provide the processed signal Sk from the master control 17 to the signal storage 15.

The temperature sensor 21 such as thermistor senses a temperature of the LD and to be arranged just beside the LD 9. The temperature sensor 21 generated a signal St that indicates the temperature of the LD 9 and provides this signal St to the master control 17.

The master control 17 sets the switch 13. The master control 17 may include a memory that stores a program and a CPU that processes the program. The master control 17 may further include analog-to-digital converters and digital-to-analog converters. The master control 17 primarily provides two functions, one of which is to control the switch 13, and the other is to revise the command Sj of the signal storage 15.

For the first function above, the master control 17 sets the switch 13 so as to connect the APC controller 11 with the LD driver 3 during the driving current Id is less than a preset threshold, which activates the APC feedback loop so as to keep the average optical power and the extinction ratio of the light L when the monitor PD 5 shows no failure and the driving current Id is in a normal condition, which is called as the normal mode. When the driving current Id reaches or exceeds the preset threshold, the master control 17 changes the switch 13 so as to connect the signal storage 15 with the LD driver 3, which makes the driving current Id constant determined by the command Sj from the signal storage 15.

The master control 17 may set the preset threshold mentioned above depending on the temperature of the LD 9. Specifically, the master control 17, receiving the signal St from the temperature sensor 21 which indicates the temperature of the LD 9, sets the preset threshold based on this signal St.

For the second function of the master control 17, the master control 17 periodically acquires the command Sapc during the APC loop is in the normal mode, and provides a command Sk corresponding to the command Sapc to the signal storage 15 to revise the control command Sj. The period to revise the command Sj may be typically 1 millisecond. When the APC feedback loop falls in the failure mode as the driving signal Id reaches the preset threshold, the command Sj becomes constant because the master control 17 changes the switch 13 to connect the signal storage 15 with the LD driver 3.

The master control 17, in addition to two functions described above, generates an alarm Sa. When the APC feedback loop falls in the failure mode, the master control 17 generates the alarm Sa to the external of the control circuit 1.

Figure 2:
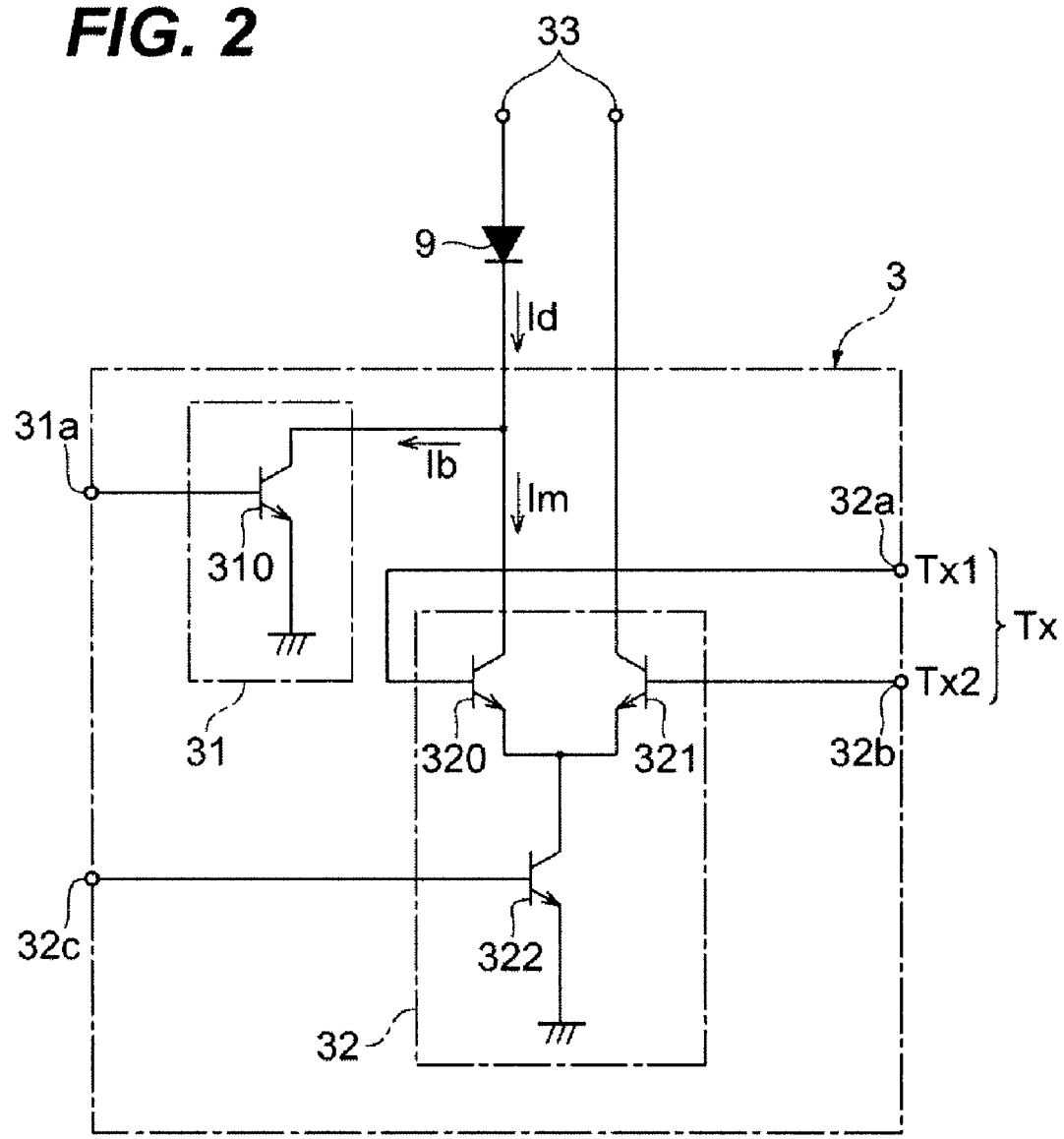
FIG. 2 is a circuit diagram of the LD driver according to the invention.

FIG. 2 illustrates a circuit diagram of the LD driver 3 that comprises a bias current generator 31 and a modulation current generator 32, the former providing the bias current Ib while the latter providing the modulation current Im to the LD 9. The anode of the LD 9 is coupled with the power supply 33.

The bias current generator 31, connected with the cathode of the LD 9, includes an npn transistor 310 whose collector is coupled with the cathode of the LD 9, the emitter thereof is grounded, and the base is coupled with the input terminal 31a to be connected with the current limiter 7. The bias current generator 31 thus configured provides the bias current Ib to the LD 9.

The modulation current generator 32 includes a pair of npn transistors, 320 and 321, that configures a differential circuit and an additional npn transistor 322 for the modulation current source. Emitters of two transistors, 320 and 321, are commonly connected to the collector of the source transistor 322. The collector of one of the differential transistors 321 is coupled with the power supply 33, while the emitter of the source transistor 322 is grounded.

Each base of the differential transistors, 320 and 321, are connected with respective input terminals, 32a and 32b, which receive the transmission signal Tx as differential signals, Tx1 and Tx2. The base of the source transistor 322 is coupled with the other input terminal 32c that is connected with the current limiter 7. Thus, the modulation current source 32 provides the modulation current Im whose magnitude is determined by a signal input to the terminal 32c and modulated with the differential signals, Tx1 and Tx2. The LD 9 is driven by the driving current Id which superposes the bias current Ib with the modulation current Im, namely, Id=Ib+Im.

Figure 3:
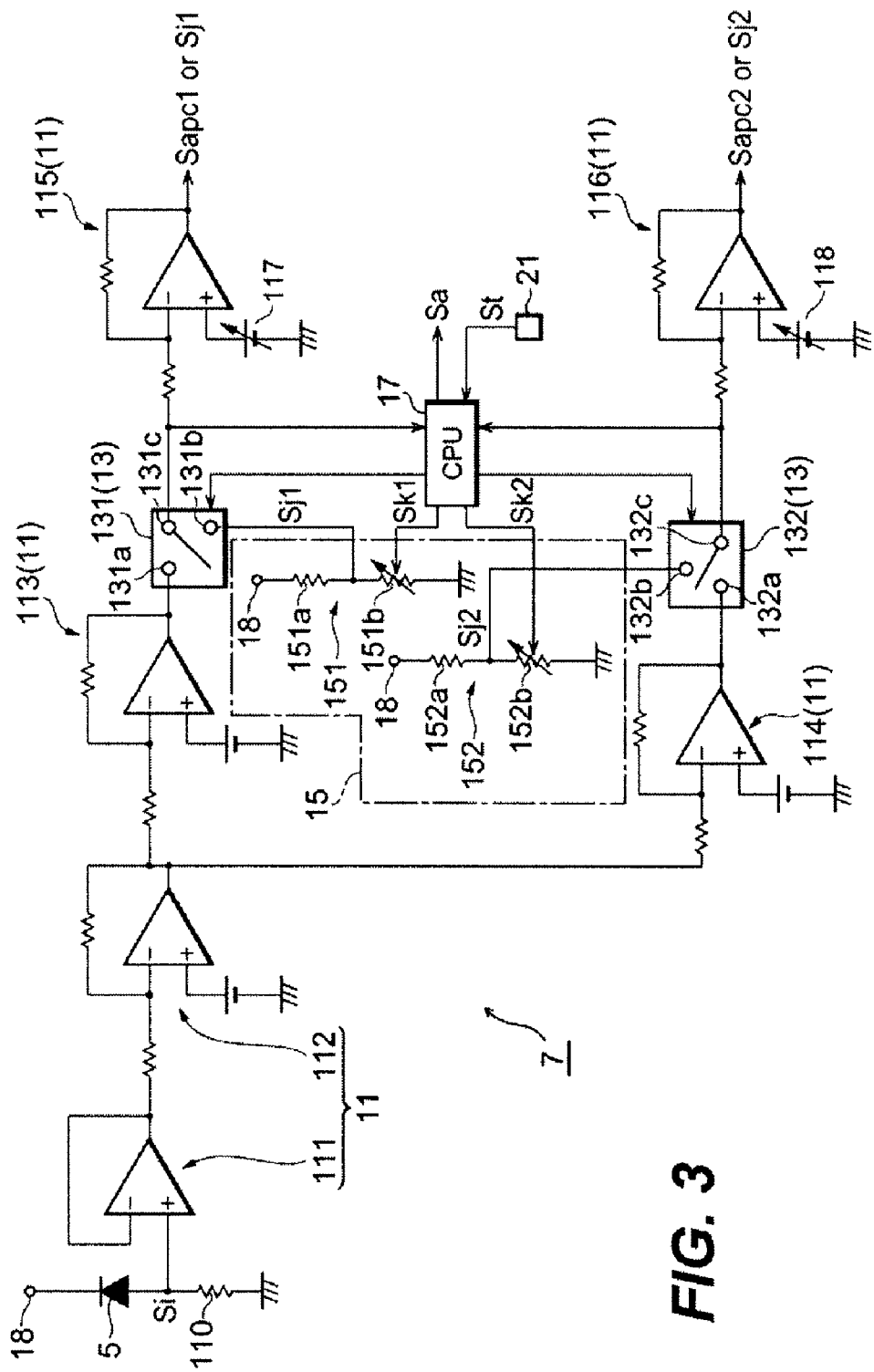
FIG. 3 is a circuit diagram of the current limiter of the invention.

FIG. 3 illustrates a circuit diagram of the current limiter 7. The cathode of the monitor PD 5 is coupled with the power supply 18, while, the anode thereof is grounded through the resistor 110. The APC controller 11 includes a buffer 111 that receives a voltage drop occurred in the resistor 110 as a source signal Si, and an amplifier 112 that inversely amplifies the output of the buffer 111, where the output of the buffer 111 is substantially equal to the source signal Si because the buffer configures with a voltage follower. The output of the amplifier 112 is inversely amplified again by the amplifier 113. The output of the amplifier 113 is input to one of terminals 131a of the switch 131. The current limiter 7 further includes another amplifier 114 that also inversely amplifies the output of the amplifier 112. The output of this amplifier 114 is coupled with a terminal 132a of another switch 132. Two switches, 131 and 132, corresponds to the switch 13 shown in FIG. 1 and are controlled in the connecting condition thereof by the master control 17.

The output 131c of the first switch 131 is coupled with the amplifier 115 whose output Sapc1 is provided with the LD driver 3. This output Sapc1 corresponds to the command Sapc in FIG. 1. The circuit shown in FIG. 3 amplifies the voltage drop caused in the resistor 110, which corresponds to the source signal Si, by the buffer 111 and amplifiers, 112, 113 and 115, to provide the output Sapc1 to the bias current generator 31 shown in FIG. 2. When the source signal Si becomes large, which is equivalent to a case the output power of the LD 9 strengthens, the control signal Sapc1 becomes small to turn down the bias current Ib so as to keep the control signal Sapc1 determined by a first reference 117.

The output 132c of the second switch 132 is coupled with the amplifier 116 whose output Sapc2 is provided with the LD driver 3. This signal Sapc2 also corresponds to the control signal Sapc shown in FIG. 1. The current limiter 7 amplifies the voltage drop caused in the resistor 110 by the buffer 111 and three amplifiers, 112, 114 and 116, to provide the control signal Sapc2 with the modulation current source 32 shown in FIG. 2. When the source signal Si becomes large, the control signal Sapc2 becomes small so as to keep the control signal Sapc2 determined by the second reference 118.

The signal storage 15 shown in FIG. 3 includes two blocks, 151 and 152, each holds the bias current Ib and the modulation current Im, respectively. The first block 151 includes two resistors, 151a and 151b, inserted between the power supply 18 and the ground. The resistor 151b configures a variable resistor. The second block 152 also includes two resistors, 152a and 152b, between the power supply 18 and the ground, where one of the resistors 152b configures a variable resistor. A signal Sj1 created by the resistors in the first block 151 is provided with the other input 131b of the first switch 131, while, another signal Sj2 created by the resistors in the second block 152 is provided with the other input 132b of the second switch 132. These signals, Sj1 and Sj2, correspond to the signal Sj appeared in FIG. 1.

The variable resistors, 151b and 152b, varies their resistance in accordance with the commands, Sk1 and Sk2, provided from the master control 17. Specifically, the master control 17, receiving the output of the switch 131, generates the command Sk1 such that the output Sj1 of the block 151 for the bias current becomes substantially equal to the output of the switch 131. Also, the controller, receiving the output of the switch 132, generates the other command Sk2 such that the output Sj2 of the block 152 for the modulation current becomes substantially equal to the output of the switch 132. Thus, the inputs, 131b and 132b of respective switches are periodically revised so as to be equal to the outputs, 131c and 132c, thereof.

The master control 17 has a function, by receiving the output of the switches, 131 and 132, to monitor the bias current Ib and the modulation current Im. During the bias current Ib is less than the threshold, the master control 17 connects the input 131a with the output 131c of the first switch 131, and connects the input 132a with the output 132c of the second switch 132 during the modulation current Im is less than its preset threshold. Once one of the bias current Ib and the modulation current Im reaches or exceeds its threshold, the master control 17 connects the input 131b with the output 131c of the first switch, and connects the input 132b with the output 132c of the second switch. In addition to the procedure above, the controller determines the thresholds of the bias current Ib and the modulation current Im depending on the temperature of the LD 9 by receiving the source signal St that indicates the temperature of the LD 9 from the temperature sensor 21.

Figure 4:
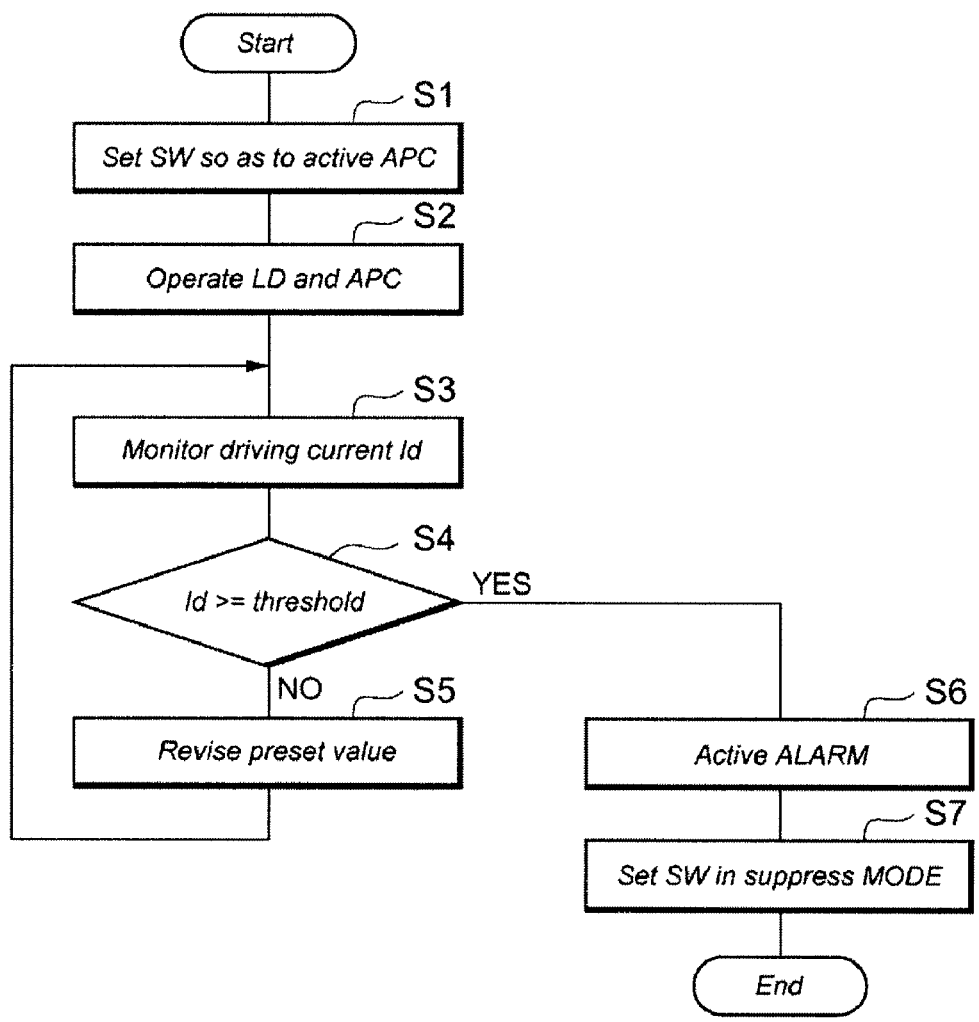
FIG. 4 shows a flow chart to driver the laser diode.

Next, a method to drive the LD using the control circuit 1 above described will be explained. FIG. 4 shows a flow chart to control the LD 9 according to the control circuit 1.

In FIG. 4, the master control 17 firstly selects the APC controller 11 by the switch 13 at step S1, which operates the APC circuit comprised of the LD 9, the monitor PD 5, and the APC controller 11. At step 2, the driving current Id is supplied to the LD 9 to start the operation, and the monitor PD 5 senses a portion of the light L emitted from the LD 9, which is usually the light Lb emitted from the back facet of the LD, to generate the source signal Si. This signal Si is conducted to the APC controller 11 to adjust the driving current Id by the command Sapc so as to set the source signal Si to be equal to the preset value.

During the APC controller 11 keeps the optical output power from the LD 9 constant, the master control 11 directly watches the command Sapc, or indirectly watches the signal Sd through the current monitor 23, to monitor the driving current Id at step S3. Concurrently with this monitoring, the master control 17 determines the threshold depending on the temperature of the LD 9 at step S3. During the driving current Id is less than the threshold, the APC controller 11 is kept active in the normal mode concurrent with periodically revising the signal Sj held by the signal storage 15 to be equal to the command Sapc at step S5.

On the other hand, once the driving current Id reaches or exceeds the threshold, which is the case that the APC feedback loop falls in the failure mode and corresponds to the branch "YES" at step S4, after the alarm Sa becomes active at step S6, the master control 17 changes the switch 13 to the signal storage 15 at step S7, which supplies the signal Sj held in the signal storage 15 to the LD driver 3 to keep the optical output power from the LD 9 constant.

Thus, according to the control circuit and the method to drive the LD 9 of the invention, because the signal storage 15 holds the signal Sj, which corresponds to the current presently provided to the LD 9 and is periodically revised, even when the driving current reaches or exceeds the threshold due to a failure of the monitor PD or something like that, the practical driving current may be kept a value corresponding to the thus held signal Sj. Accordingly, the control circuit is able to operate temporarily even after the failure occurs as long as the ambient temperature does not widely change.

Moreover, The master control 17 determines the threshold depending on the temperature of the LD 9. It is well known that an ordinarily LD shows a large temperature dependence in its characteristics. For instance, the driving current necessary for the LD to emit light with a power of 5 mW is around 30 mA in a low temperature, while, it becomes about 70 mA at a high temperature, which is more than twice of that at the low temperature. Under such a condition, it would be inadequate to set the threshold constant independent of the temperature.

While the preferred embodiments of the present invention have been described in detail above, many changes to these embodiments may be made without departing from the true scope and teachings of the present invention. For example, although the embodiment above described provides a signal storage constituted of variable resistors, the signal storage may be performed by a memory. On the other hand, although the embodiment concentrates on the master control including the digital circuits of the memory and the CPU, the master control may be an analogue circuit. The present invention, therefore, is limited only as claimed below and the equivalents thereof.

What is claimed is:

1. A control driver circuit for a semiconductor laser diode that emits signal light, comprising:
    a laser diode driver configured to supply a driving current to said laser diode;
    a monitor photodiode configured to detect a portion of said signal light and to generate a source signal corresponding to said portion of signal light; and
    a current limiter including a master control, a switch, a memory, and an APC controller, said APC controller constituting an APC feedback loop by a co-operation with said laser diode, said monitor photodiode, and said laser diode driver, said master control connecting said laser driver with said APC controller by turning said switch on to activate said APC feedback loop to determine said driving current in a normal mode, said driving current in said normal mode being stored in said memory, wherein said master control connects, when said APC feedback loop falls in a failure mode, said laser diode driver with said memory to provide said driving current stored in said memory.

2. The control circuit according to claim 1, wherein said current limiter decides said failure mode by comparing said driving current determined by said APC feedback loop with a threshold.

3. The control circuit according to claim 2, wherein said control circuit further comprises a temperature sensor to detect a temperature of said laser diode, and wherein said current limiter determines said threshold based on a temperature of said laser diode detected by said temperature sensor.

4. A method to control a semiconductor laser diode to emit light by being provided with a driving current whose magnitude is determined by an APC feedback loop that is comprised of said laser diode, a monitor photodiode, an APC controller and a laser diode driver, said driving current determined by said APC feedback loop being periodically stored in a memory, said method comprising the steps of:

breaking said APC feedback loop when said APC feedback loop falls in a failure mode by comparing said driving current with a threshold; and providing said driving current stored in said memory to said laser diode driver.

5. The method according to claim 4, further comprising a step of, before said step of breaking said APC feedback loop, detecting a temperature of said laser diode, and correcting said threshold based on said detected temperature of said laser diode.

* * * * *